(12) United States Patent  (10) Patent No.: US 6,558,170 B1
Lemke  (45) Date of Patent: May 6, 2003

(54) STRAIN RELIEF FOR BGA CONNECTOR

(75) Inventor: Timothy A. Lemke, Dillsburg, PA (US)

(73) Assignee: FCI Americas Technology, Inc., Reno, NV (US)

( * ) Notice: Subject to any disclaimer, the term of this patent is extended or adjusted under 35 U.S.C. 154(b) by 0 days.

(21) Appl. No.: 09/718,587

(22) Filed: Nov. 22, 2000

(51) Int. Cl.[7] .............................. H01R 12/00
(52) U.S. Cl. ......................... 439/83; 439/74
(58) Field of Search .............. 439/74, 83, 70, 439/71

(56) References Cited

U.S. PATENT DOCUMENTS

| 3,781,596 | A |   | 12/1973 | Galli et al. ............... 317/101 F |
|---|---|---|---|---|
| 4,969,829 | A | * | 11/1990 | Sato ........................... 439/566 |
| 5,186,383 | A |   | 2/1993  | Melton et al. ........... 228/180.2 |
| 5,205,750 | A |   | 4/1993  | Darrow et al. ............... 439/77 |
| 5,381,848 | A |   | 1/1995  | Trabucco ................... 164/102 |
| 5,400,950 | A |   | 3/1995  | Myers et al. ............. 228/180.2 |
| 5,435,732 | A |   | 7/1995  | Angulas et al. ............... 439/67 |
| 5,490,040 | A |   | 2/1996  | Gaudenzi et al. ........... 361/773 |
| 5,583,376 | A |   | 12/1996 | Sickler et al. .............. 257/702 |
| 5,641,946 | A |   | 6/1997  | Shim ........................... 174/261 |
| 5,667,388 | A | * | 9/1997  | Cottrell ........................ 439/74 |
| 5,702,255 | A |   | 12/1997 | Murphy et al. ............... 439/71 |
| 5,722,160 | A |   | 3/1998  | Uemura et al. ............... 29/840 |
| 5,742,484 | A |   | 4/1998  | Gillette et al. .............. 361/789 |
| 5,796,169 | A |   | 8/1998  | Dockerty et al. ........... 257/780 |
| 5,859,538 | A |   | 1/1999  | Self ............................. 324/755 |
| 6,079,991 | A |   | 6/2000  | Lemke et al. ................. 439/83 |
| 6,116,922 | A |   | 9/2000  | Szu et al. ...................... 439/83 |

FOREIGN PATENT DOCUMENTS

| EP | 1 001 462 | 5/2000 |
|---|---|---|
| WO | PCT/US97/18066 | 10/1997 |
| WO | WO98/15989 | 4/1998 |

OTHER PUBLICATIONS

U.S. Non–Provisonal Patent Appl. No. 09/465,164. Filed: Dec. 16 1999.

* cited by examiner

Primary Examiner—Tulsidas Patel
(74) Attorney, Agent, or Firm—Woodcock Washburn LLP

(57) ABSTRACT

The invention includes an electrical connector having a housing, and a first plurality of contacts in the housing that are adapted to be in electrical communication with a first substrate. The electrical connector further includes a second plurality of contacts in the housing that are adapted to be coupled to the first substrate. A first body of reflowable, electrically conductive material disposed on at least one of the first contacts, and a second body of material disposed on at least one of the second contacts. The first body is adapted to provide an electrical path between the connector and the first substrate, and the second body is adapted to provide relief for mechanical strain between the connector and the first substrate. The second body may also be peripheral to the first body, and/or positioned along a series of contacts adjacent to an edge of the connector.

8 Claims, 9 Drawing Sheets

STRAIN RELIEF FOR BGA CONNECTOR

CROSS-REFERENCE TO RELATED APPLICATION

The subject matter disclosed herein is related to the subject matter disclosed in application Ser. No. 09/465,164, filed on Dec. 6, 1999, herein incorporated by reference.

FIELD OF THE INVENTION

The present invention relates to an electrical connector. More specifically, the present invention relates to high input/output density connectors, such as surface mount connectors using ball grid array (BGA) technology.

BACKGROUND OF THE INVENTION

The recent drive for smaller, more functional electronic equipment, particularly personal portable devices, has created an ongoing need for miniaturization of all components, especially electrical connectors. Efforts to miniaturize connectors have included reducing the pitch between terminals in single or double row linear connectors. This permits a relatively larger number of connections in the ever decreasing space allotted for connectors on circuit substrates. The drive for smaller electronic equipment has also been accompanied by a recent preference for surface mount techniques (SMT) for mounting components on circuit boards. However, because reducing the pitch between terminals increases the risk of bridging adjacent solder pads during the reflow of solder paste, SMT has been pushed to its limits for high volume, low cost operations.

To satisfy the need for increased terminal density in SMT, array connectors have been proposed. In particular, as described in PCT Application No. PCT/US97/18066, filed Oct. 7, 1997, entitled High Density Connector and Method of Manufacture, incorporated herein by reference, ball grid array (BGA) connectors have become a reliable and efficient technique for mounting high density electrical connectors on substrates using SMT. BGA connectors have an insulative connector housing. One side of the connector housing has a matrix of spherical solder balls, positioned to engage the conductive paths of a circuit substrate. The opposite side of the connector housing has a corresponding matrix of contact terminals, which extend through the connector housing and connect electrically to the solder balls. These contact terminals are designed to engage another BGA connector, similarly connected to another substrate, thus permitting board-to-board interconnection.

Because of their low profile, BGA connectors may be used to interconnect a number of various types of circuit substrates, including flexible circuits. A flexible circuit is a pliable electrical conductor device in which conductive tracings are photolithographed on a base sheet of polyimide or polyester film, such as manufactured and sold by E.I. du Pont de Nemours & Co. under the trademarks "Kapton" (U.S. Pat. No. 3,781,596) or "Mylar." Because of their lightweight and ability to bend, flexible circuits are often used in confined locations, including portable computers and portable communication devices. The flexibility of the circuit substrate may introduce strain to the solder joint during handling. In addition, these confined locations make it difficult to dissipate heat generated by thermal cycling.

Thermal cycling can occur, for example, as the semiconductor device on the circuit substrate switches on and off. The electrical power dissipated within a semiconductor device heats the various components of the system, such as the substrate, the solder balls, the contacts, and the BGA connector housing. Due to differences in the coefficients of thermal expansion (CTE), temperature changes cause the various components to expand and to contract differently. This CTE differential may introduce mechanical stress in the solder joint between the connector and the substrate. Repeated thermal cycling can reduce the life of the solder joint. Although heat generated by thermal cycling is always a concern with substrate interconnections, it is especially important with BGA connectors because of their frequent use in confined locations. In addition, CTE differential effects become more pronounced as the size of the connector increases.

Therefore, a need exists to provide a BGA connector system with mechanical relief for absorbing strain created during thermal cycling.

SUMMARY OF THE INVENTION

The disadvantages of prior connector systems are overcome and significant advantages achieved in an electrical connector having a housing, and a first plurality of contacts in the housing that are adapted to be in electrical communication with a first substrate. The electrical connector further includes a second plurality of contacts in the housing that are adapted to be coupled to the first substrate. A first body of reflowable, electrically conductive material disposed on at least one of the first contacts, and a second body of material disposed on at least one of the second contacts. The first body is adapted to provide an electrical path between the connector and the first substrate, and the second body is adapted to provide relief for mechanical strain between the connector and the first substrate. The first and second bodies may be spherical. The second body may also be peripheral to the first body, and/or positioned along a series of contacts adjacent to an edge of the connector. The contacts of the electrical connector may form a matrix array. In this instance, the second body may be disposed on one or more of the contacts of the matrix array, and/or on one or more rows of contacts of the matrix array. The second body also may be disposed on one or more columns of contacts of the matrix array, and/or one or more corners of the matrix array. The second plurality of contacts may remain within the housing and not engage contacts of a mating connector. The electrical connector further may include a third plurality of contacts adapted to be in electrical communication with a second substrate, and a fourth plurality of contacts adapted to be coupled to the second substrate. The third and fourth contacts may be adapted to be removably connected to the first and second contacts. The electrical connector also may include a third body of reflowable, electrically conductive material disposed on at least one of the third contacts. The third body may be adapted to provide an electrical path between the connector and the second substrate. The electrical connector also may include a fourth body of reflowable, electrically conductive material disposed on at least one of the fourth contacts. The fourth body may be adapted to provide relief for mechanical strain between the connector and the second substrate caused by a temperature change.

The invention also includes a device for coupling and absorbing strain between a first and second substrate. The device includes a first electrical connector, and a second electrical connector mateable with the first connector. The first electrical connector has a first housing having a first side and a second side, a first plurality of contacts extending from the first side of the first housing, and a first body of material disposed on at least one of the first contacts. The material is adapted to be connected to the first substrate. The second electrical connector has a second housing having a first side and a second side, a second plurality of contacts extending from the first side of the second housing, and a second body of material disposed on at least one of the first contacts. The material is adapted to be connected to the second substrate. Also, the second side of the second housing is adapted to be removably connected to the second side of the first housing, and a portion of the first and second plurality of contacts do not mate. The first and second body of material may be spherical, and may be composed of conductive material. Also, the portion of the first and second plurality of contacts may be embedded within the housings.

The invention further includes a method for providing mechanical strain relief to a connector system. The method includes providing an electrical connector having a first and second plurality of contacts, disposing a first body of reflowable, electrically conductive material on at least one of the first contacts, and disposing a second body of reflowable, electrically conductive material on at least one of the second contacts. The first body is adapted to provide an electrical path between the connector and a first substrate, and the second body is adapted to provide relief for mechanical strain between the connector and the first substrate. The second body may be peripheral the first body, and may be positioned along a series of contacts adjacent to an edge of the connector. The inventive method may include mounting the electrical connector on the substrate. Also, the contacts may form a matrix array. The inventive method may include disposing the second body on one or more of the contacts of the matrix array, and disposing the second body on one or more rows of contacts of the matrix array. The inventive method may further include disposing the second body on one or more columns of contacts of the matrix array, and/or disposing the second body in one or more corners of the matrix array.

The invention includes an improved ball grid array connector having a plurality of contacts in a housing. The improved connector is engeagable with a mating connector and the improvement includes a portion of the plurality of contacts that remain within the housing so as not to engage the mating connector.

BRIEF DESCRIPTION OF THE DRAWINGS

The present invention will be better understood, and its numerous objects and advantages will become apparent by reference to the following detailed description of the invention, when taken in conjunction with the following drawings where.

DETAILED DESCRIPTION OF PREFERRED EMBODIMENT

Figure 1:
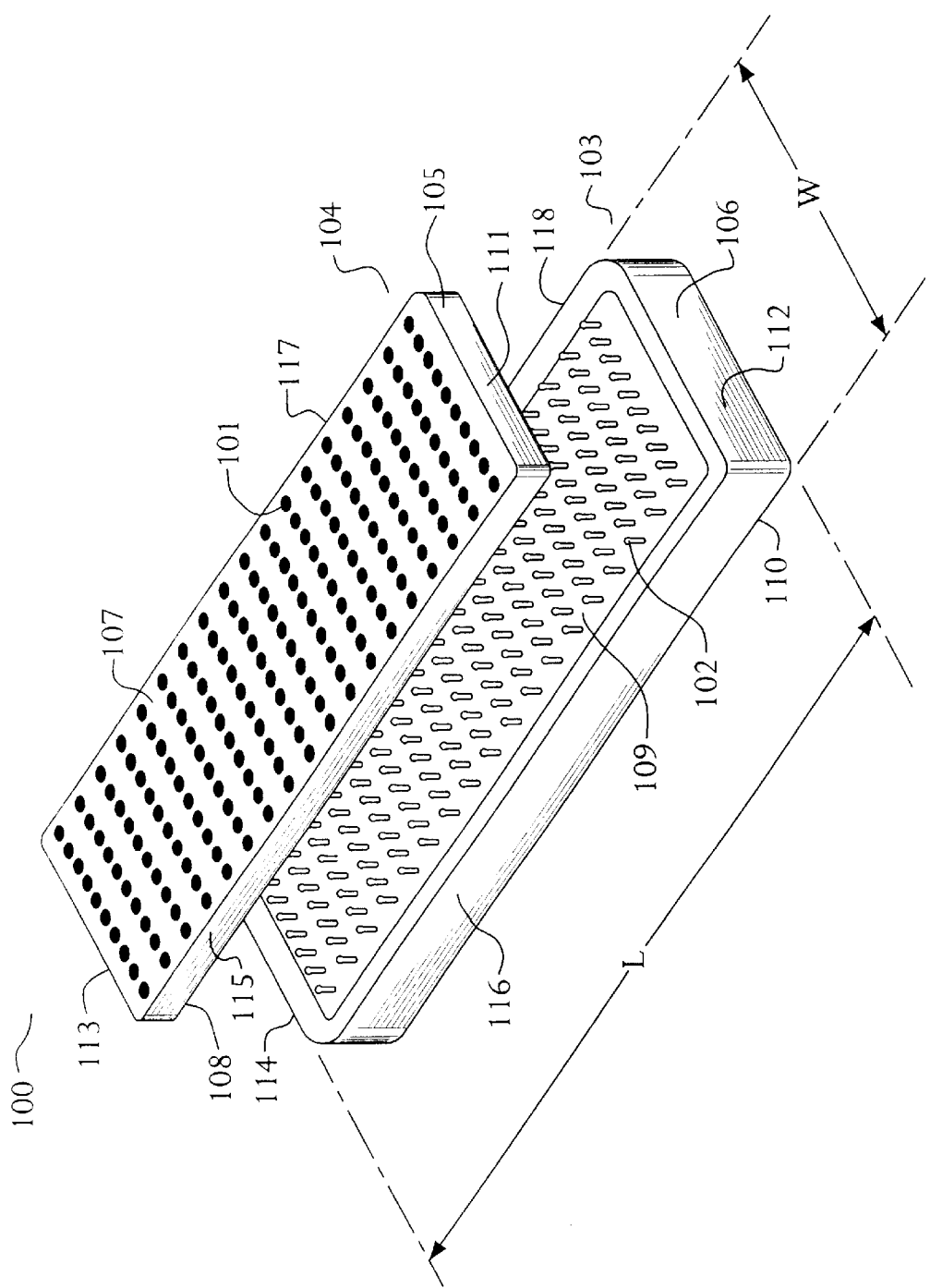
FIG. 1 is a perspective view of one embodiment of the present invention in which a plurality of contacts form a matrix array.
Figure 2:
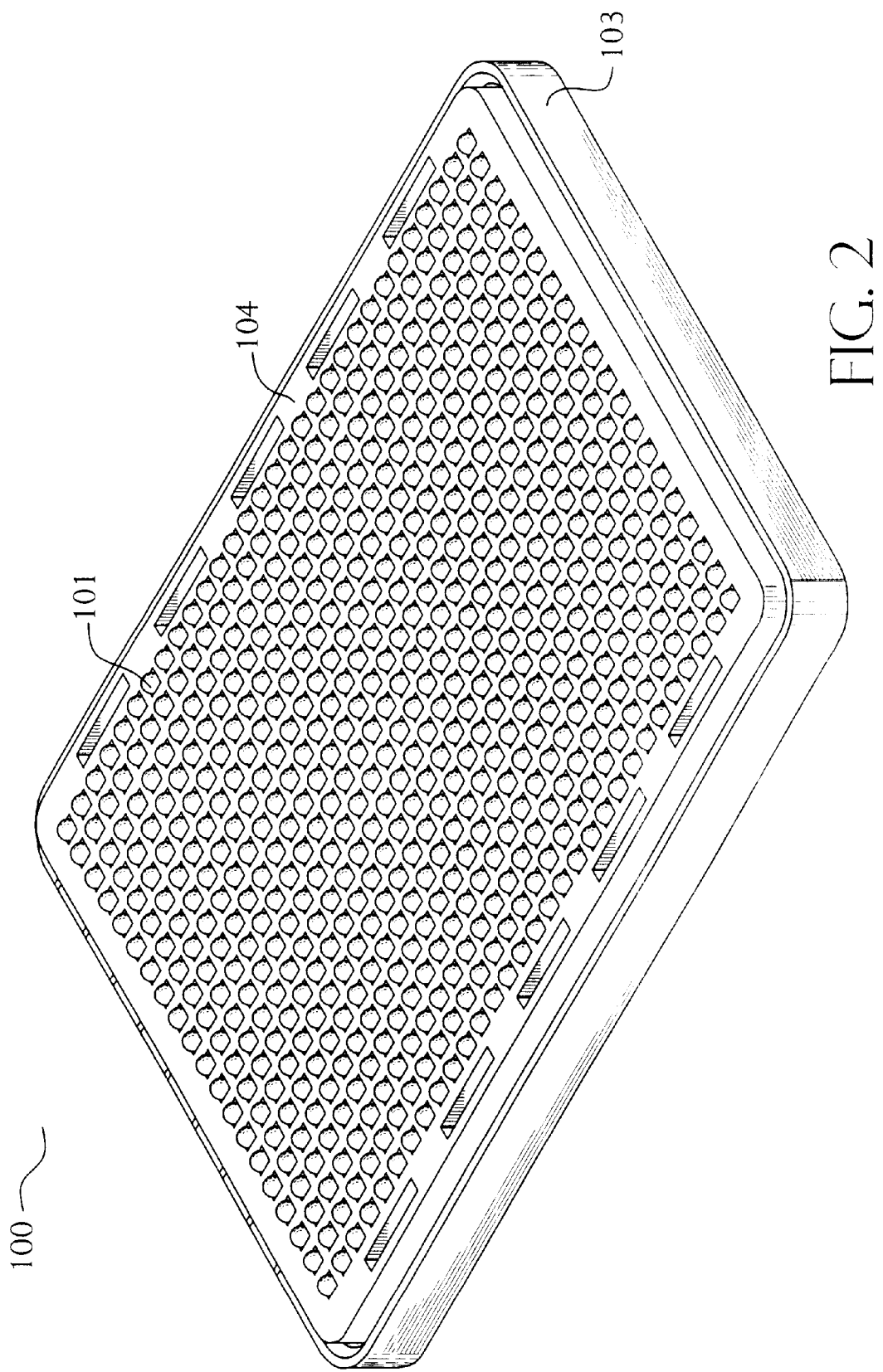
FIG. 2 is a perspective view of the embodiment depicted in FIG. 1 in a mated, closed condition.
Figure 3:
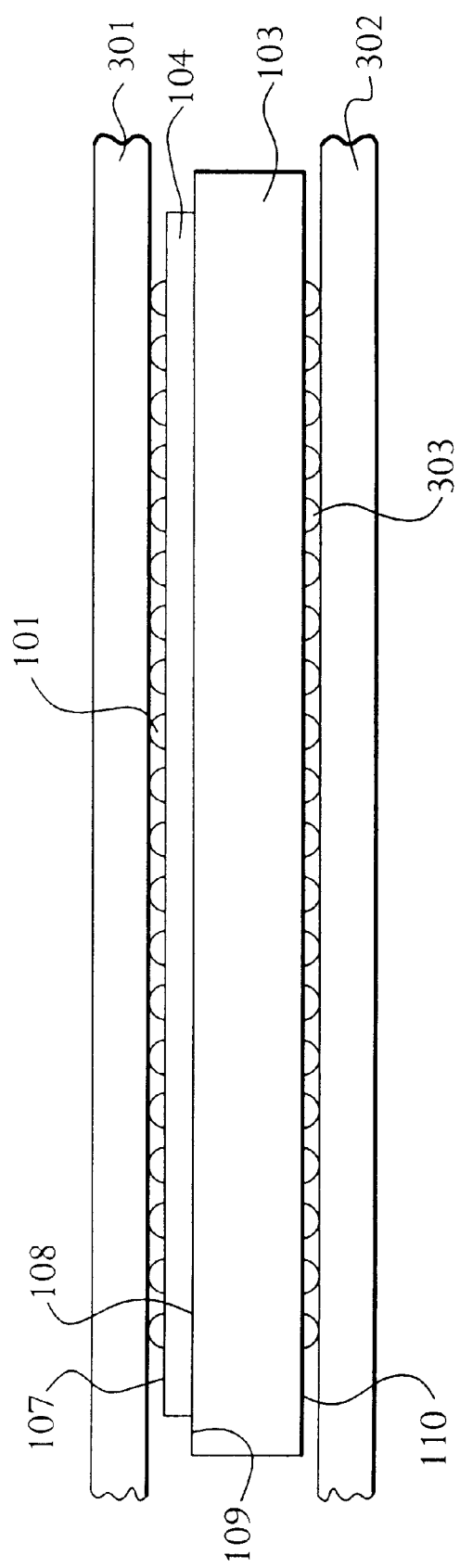
FIG. 3 is a side view of the embodiment depicted in FIG. 2.

In general, the present invention is a board-to-board electrical connector system, wherein an electrical connector is attached to a corresponding board by a plurality of fusible elements, such as solder balls, some of which provide the connector system with mechanical strain relief caused by thermal cycling. FIGS. 1–3 show various views of one embodiment of the invention.

An electrical connector system 100 includes a plug connector 104 and a receptacle connector 103. Plug 104 and receptacle 103 are removably engageable. Plug 104 and receptacle 103 each may have generally planar insulative housings 105 and 106, respectively. These housings 105, 106 are preferably manufactured from an electrically non-conductive plastic, such as liquid crystal polymer (LCP). Plug 104 has a first edge 115, a second edge 117, a first side 111, and a second side 113. Similarly, receptacle 103 has a first edge 116, a second edge 118, a first side 112, and a second side 114. Connector 100 has an overall length l and an overall width w. Receptacle 103 and plug 104 typically have a peripheral wall to protect the contacts and to provide rough alignment of receptacle 103 and plug 104 during mating. Connector 100 preferably interconnects two substrates 301, 302 (as shown in FIG. 3), such as flexible printed circuit boards. Housing 105 has a mounting end 107 facing substrate 301 and a mating end 108 facing receptacle 103. Similarly, receptacle 103 has a housing 106 that has a mounting end 110 facing substrate 302 and a mating end 109 facing plug 104.

A plurality of contacts 102 extend generally perpendicular from mating end 109 of receptacle 103. Similarly, a plurality of contacts 417 (shown in FIG. 4) extend generally perpendicular from mating end 108 of plug 104. Contacts 102, which mate with contacts 417, may be any one of a number of different types, including blade-type and round pin contacts. In addition, contacts 102, 417 may include several different types of contacts in a single plug or receptacle.

Plurality of contacts 102 on receptacle 103 extend through housing 106 from mating end 109 to mounting end 110. Fusible elements, such as solder balls 303, attach to contacts 102 on mounting end 110 of housing 106. Similarly for plug 104, plurality of contacts 417 (shown in FIG. 4) extend through housing 105 from mating end 108 to mounting end 107. Fusible elements, such as solder balls 101, attach to contacts 417 on mounting end 107 of housing 105. Preferably, contacts 102, 417 form a matrix array of contacts, as shown in FIGS. 1 and 2. Consequently, solder balls 101, 303 also preferably form a matrix array. As used throughout, a column refers to a group of solder balls 101, 303 that extend along length l of connector 100. A row refers to a group of solder balls 101, 303 that extend along width w of connector 100.

Figure 4:
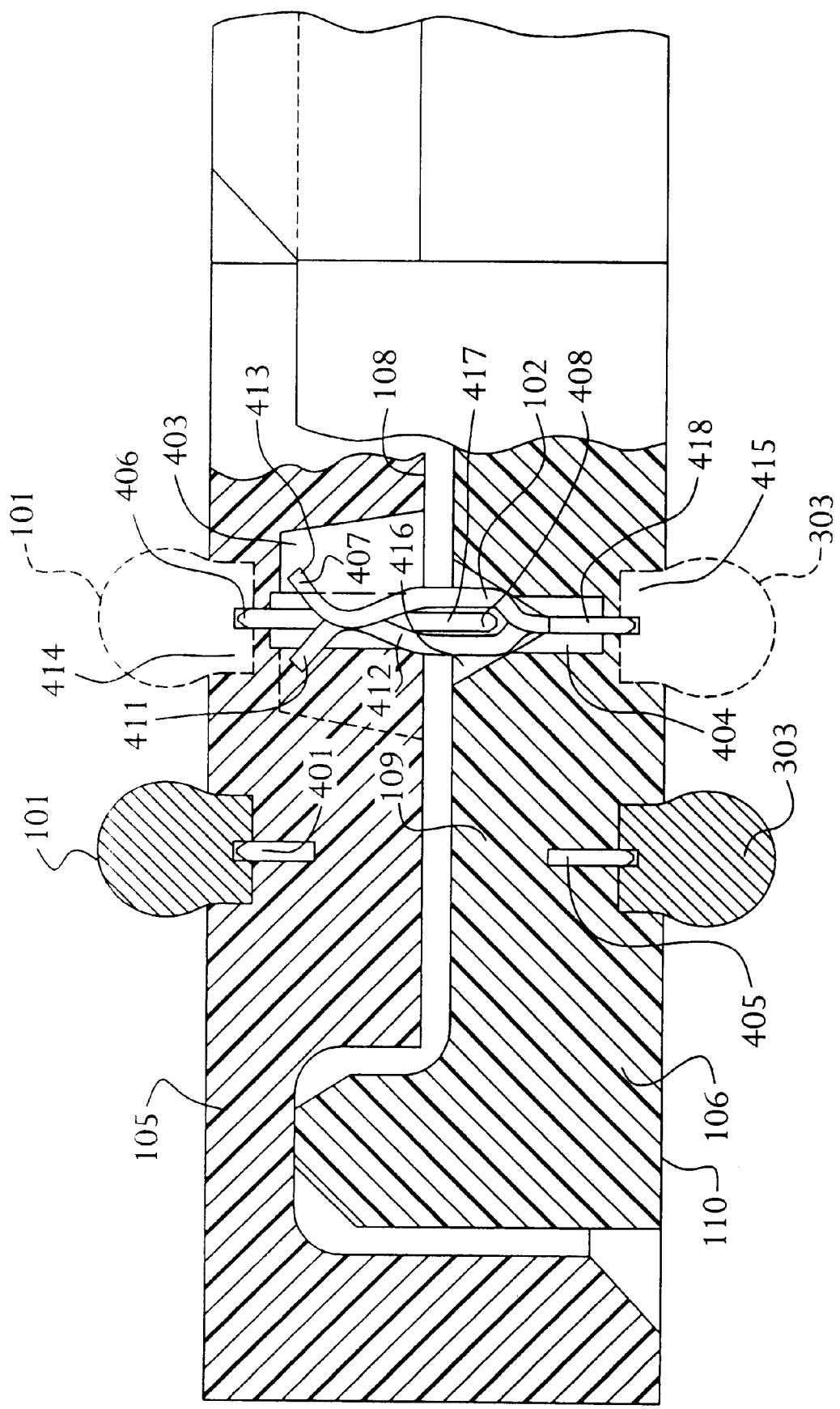
FIG. 4 is a side cross-sectional view in fragment of the embodiment depicted in FIG. 3.

Solder balls 101, 303 attach to contacts 401, 405 (shown in FIG. 4). As also shown in FIG. 4, certain contacts 401, 405 do not extend through housings 105, 106. Rather, these contacts remain within housings 105, 106 and will not engage the contacts from the mating connector. These solder balls are used to provide strain relief by absorbing stress on connector 100 that occurs during thermal cycling. These solder balls and their corresponding contacts are discussed in greater detail with reference to FIG. 4.

As shown in FIG. 3, plug 104 mounts to substrate 301 via solder balls 101, preferably with present reflow techniques used in Ball Grid Array (BGA) technology. Similarly, receptacle 103 mounts to substrate 302 via solder balls 303. Because contacts 102 and 417 are electrically connected to solder balls 303 and 101, respectively, when connector 100 is in a closed, mated position (as shown in FIGS. 2–4), substrate 301 is electrically interconnected to substrate 302. Preferably, either one or both of substrates 301 and 302 are flexible circuit substrates.

FIG. 4 is a side cross-sectional view in fragment of the connector. FIG. 4 illustrates solder balls connected to contacts that extend through housing 105, as well as those that do not extend through housing 105. In particular, contacts 102 reside within apertures 404 of housing 106. Contacts 102 are held within apertures 404 by interference fit and extend generally perpendicular to mating end 108 of housing 105. Similarly, contacts 417 reside within apertures 403 of housing 105, and are held within apertures 403 by interference fit. Alternatively, the contacts could be overmolded into housing 105. Contacts 417 extend generally perpendicular to mating end 109 of housing 106. Contacts 102 and contacts 417 have tail portions 406 and 418, respectively. Tail portions 406 and 418 extend into recesses 415 and 416, respectively. Tail portions 406 and 418 provide an electrical connection point for solder balls 303 and 101, respectively, which may be placed in recesses 414 and 415 of housings 105 and 106, respectively. PCT Application No. PCT/US97/18066, filed Oct. 7, 1997, entitled High Density Connector and Method of Manufacture, discloses methods of securing a solder ball to a contact and of securing a solder ball to a substrate.

Contacts 102 also have upper arms 407 and 411, flexibly connected to tail portions 418 of contacts 102. Upper arms 407 and 411 have a converging section 412 and an outwardly diverging lead-in section 413. As plug 104 and receptacle 103 mate, upper portions 408 of contacts 417 flexibly engage upper arms 407 and 411 of contacts 102. Recess 416 permits upper arms 407 and 411 to outwardly flex and accept upper portions 408 of contacts 417 into outwardly diverging lead-in section 413. Although not shown in FIG. 4 for the sake of clarity, solder balls 101 and 303 attach to tail portions 418 and 406, respectively. Solder balls 101 and 303 attached to tail portions 418 and 406, respectively, may provide a variety of electrical functions including carrying a signal, ground or power. As a result, contacts 102 are electrically connected to contacts 417, and thus solder balls 303 are electrically connected to solder balls 101. Although FIG. 4 shows contacts 417 as blade-type contacts and contacts 102 as dual beam-type contacts, it should be appreciated that they may be any one of a number of different type contacts, including round pin contacts. In addition, contacts 102, 417 may include several different types of contacts in a single plug or receptacle.

Connector 100 includes one or more solder balls with contacts that do not pass through their respective housings. In particular, certain solder balls 101, 303 attach to contacts 405, 401, respectively. Contacts 401 are held within housing 105 by interference fit and extend generally perpendicular to mating end 108. However, unlike contacts 417, contacts 401 do not extend through housing 105, but instead terminate within housing 105. Similarly, contacts 405 are held within housing 106 by interference fit and extend generally perpendicular to mating end 109, or by any other suitable manner. Again, unlike contacts 418, contacts 405 do not extend through housing 106, but instead terminate within housing 106. Solder balls 101 and 303 attached to contacts 405 and 401, and provide relief for mechanical strain between substrates 301, 302 and connector 100. Such mechanical strain may be due to thermal cycling.

Although the need for such mechanical strain relief due to temperature effects exists with any circuit substrate, an additional area of particular concern exists where solder balls 101, 303 are attached to substrates 301, 302 that are flexible circuits. This is so because even the mere handling of the flexible circuits can introduce strain to the solder joint. This strain can potentially reduce the life of the solder joint. Thus, the reduction of strain is unique to each application (depending on the operating environment and operational life requirements).

FIGS. 5–8 show plan views of various preferred arrangements of solder balls 101 on housing 105 of plug 104 designated as strain relief solder balls 501 with respect to solder balls 101 designated as "operational" solder balls 502. An "operational" solder ball is a solder ball that connects to a contact that engages a contact in the mating connector. Such contacts can be used, for example, to transmit signals, to supply power, or to establish ground. Although FIGS. 5–8 show the arrangement of solder balls 101 on plug 104, it should be appreciated that the same configuration may be present for solder balls 303 on housing 106 of receptacle 103. In each of the Figures, strain relief solder balls 501 located on plug 104 are shown filled-in or solid, while "operational" solder balls 502 are shown without fill or hollow. Although FIGS. 5–8 designate solder balls 101 as either strain relief solder balls 501 or "operational" solder balls 502, it should be appreciated that a portion of solder balls 101 may have no function whatsoever. Moreover, while FIG. 4 shows solder balls 101 and 303 attached to corresponding contacts 102 and 417, respectively, it should be appreciated that strain relief solder balls 501 may not be required to be attached to contacts 102 and 417, but may be secured to housings 105, 106 by other mounting techniques.

Figure 5:
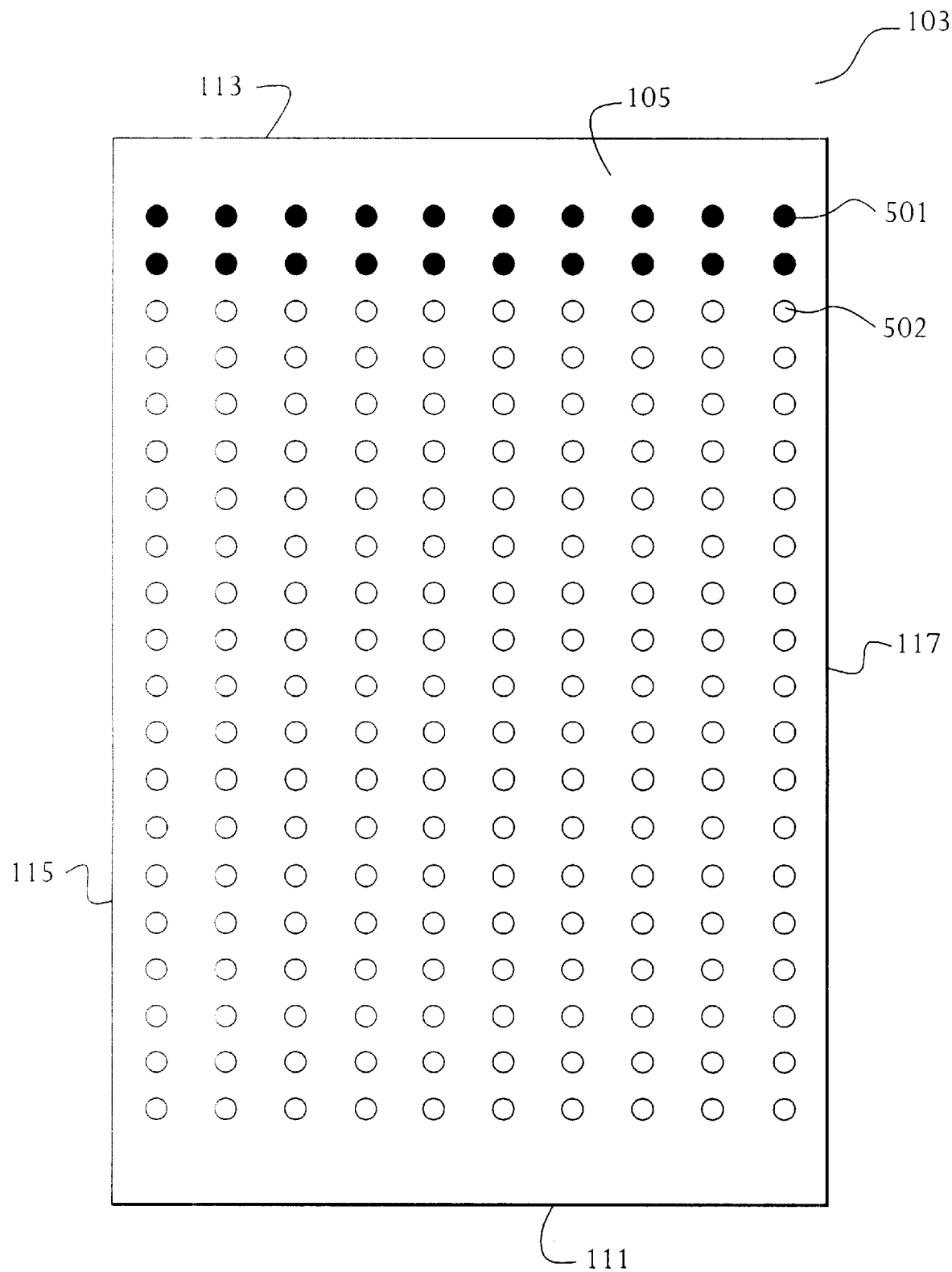
FIG. 5 is a plan view of a preferred embodiment according to the invention.
Figure 6:
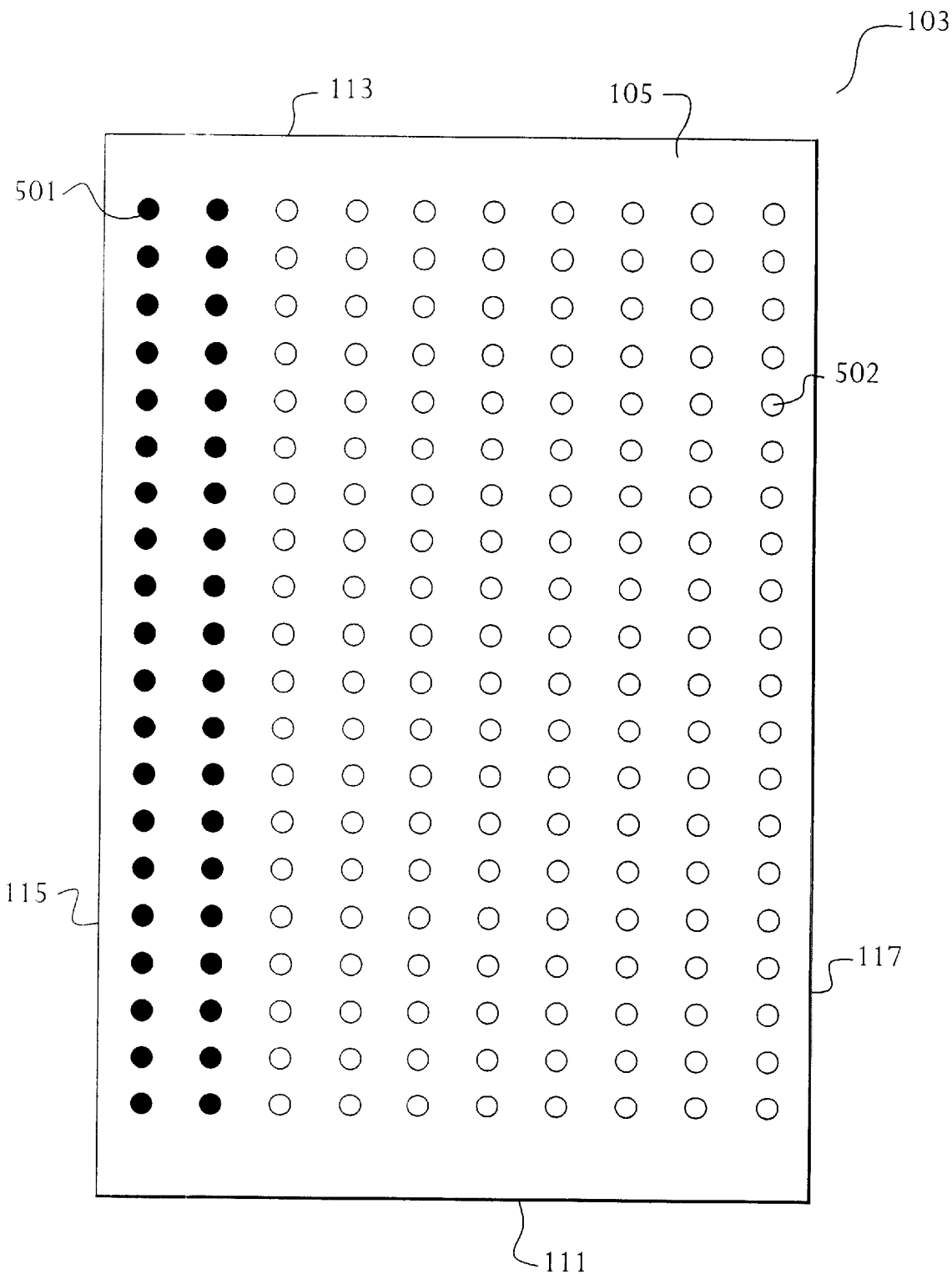
FIG. 6 is a plan view of another preferred embodiment according to the invention.
Figure 7:
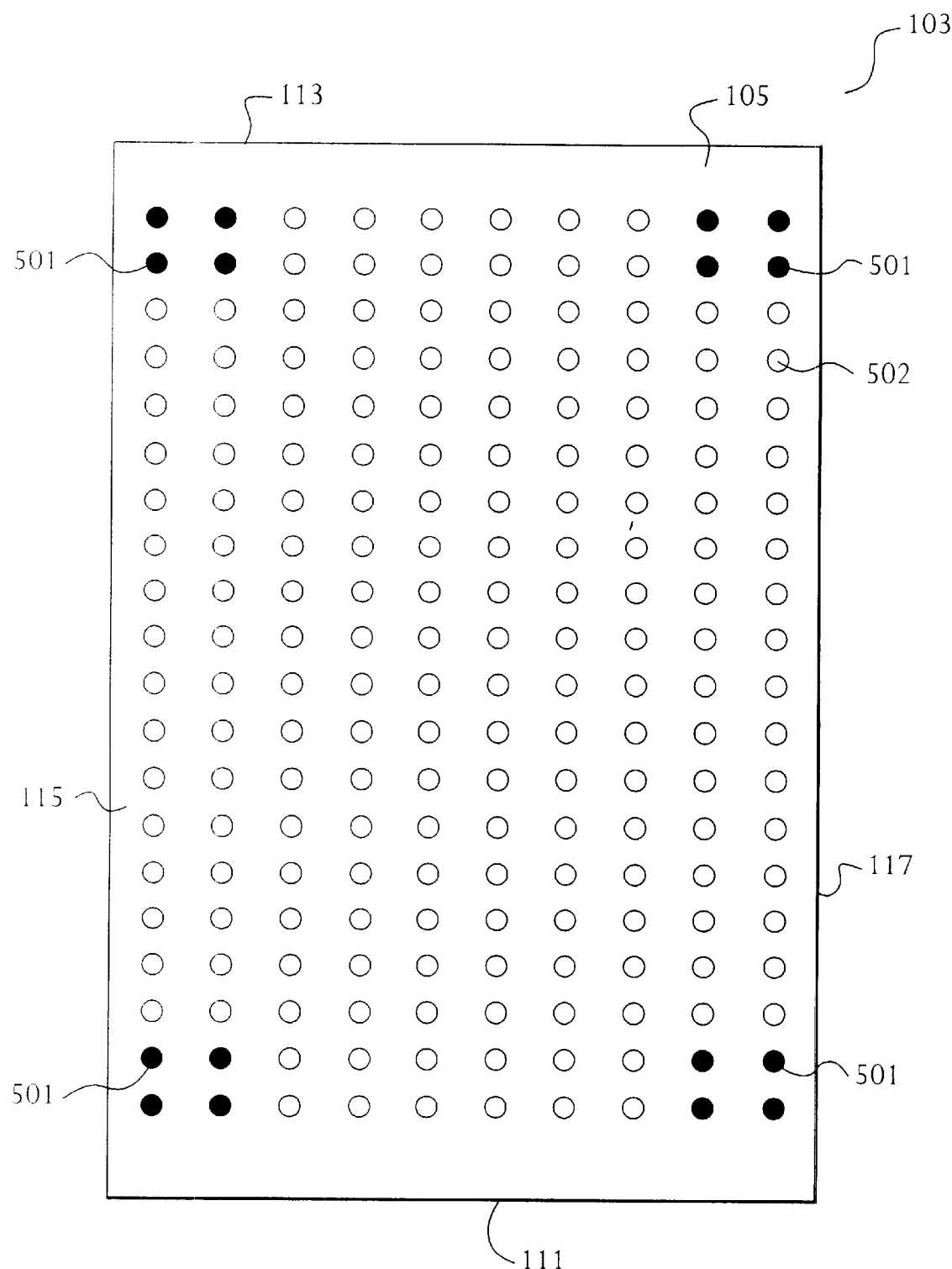
FIG. 7 is a plan view of another preferred embodiment according to the invention.
Figure 8:
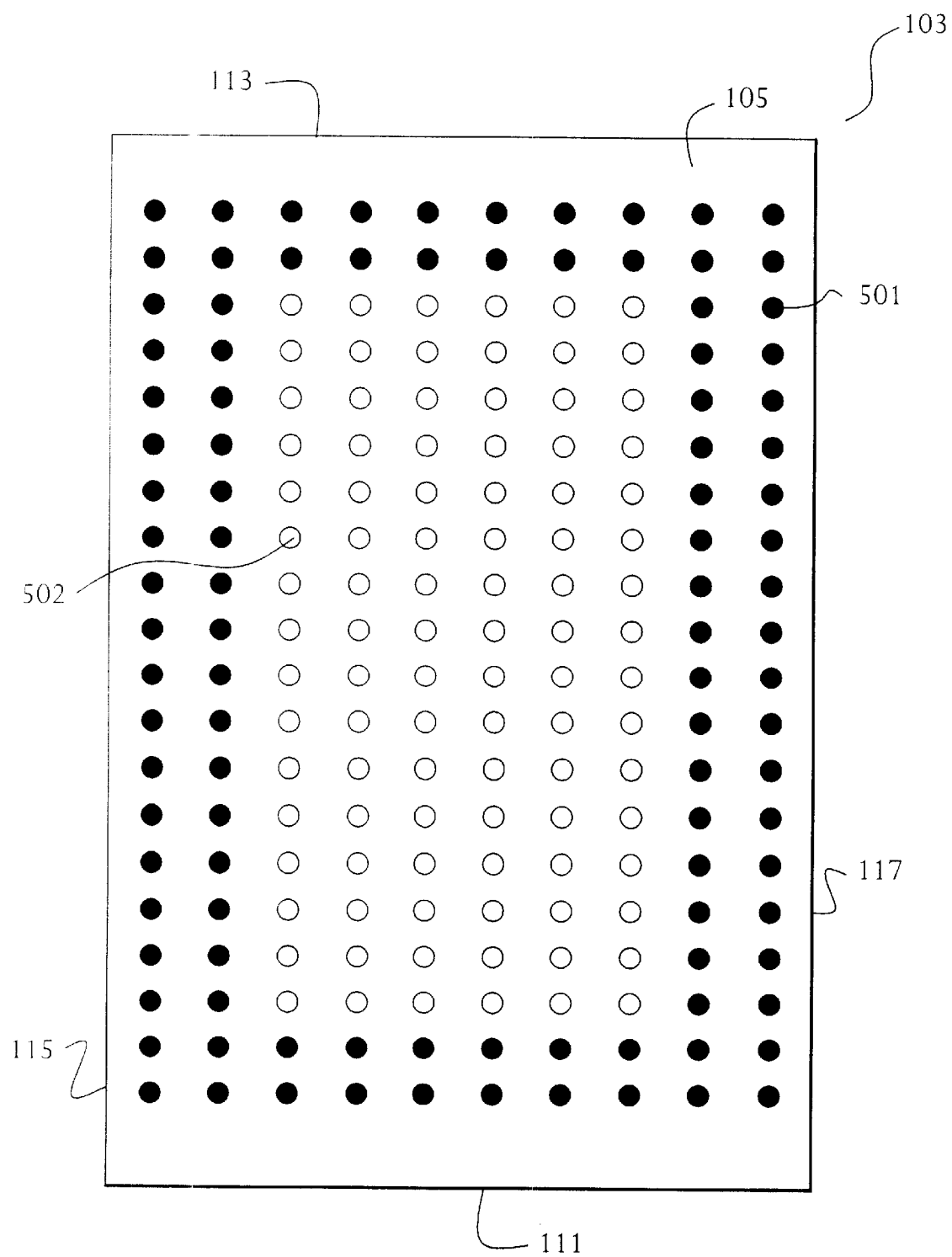
FIG. 8 is a plan view of another preferred embodiment according to the invention.

FIG. 5 shows strain relief solder balls 501 arranged along two rows nearest second side 113 of plug 104. FIG. 6 shows strain relief solder balls 501 arranged along two columns nearest first edge 115 of plug 104 and receptacle 103. FIG. 7 shows strain relief solder balls 501 grouped in corners of plug 104 and receptacle 103. Although FIG. 7 shows strain relief solder balls 501 located in every corner of plug 104, it should be appreciated that strain relief solder balls 501 may be grouped in any one or more of the corners, depending on the specific application of the connector system (i.e., depending on the particular strain relief desired). Finally, FIG. 8 shows strain relief solder balls 501 located around a periphery of "operational" solder balls 502. The arrangement of strain relief solder balls 501 shown in FIG. 8 permits strain relief for the connector system in all directions. Deciding which arrangement is most preferred is determined by considering which part of the plug will undergo strain first, and placing strain relief solder balls 501 thereon.

Although FIGS. 1–8 illustrate placing the strain relief solder balls on the same housing as "operational" solder balls, it should be appreciated this is just one example, and that the invention is not so limited. In particular, the strain relief solder balls may be located on different housings proximate to the housings that hold "operational" solder balls.

Figure 9:
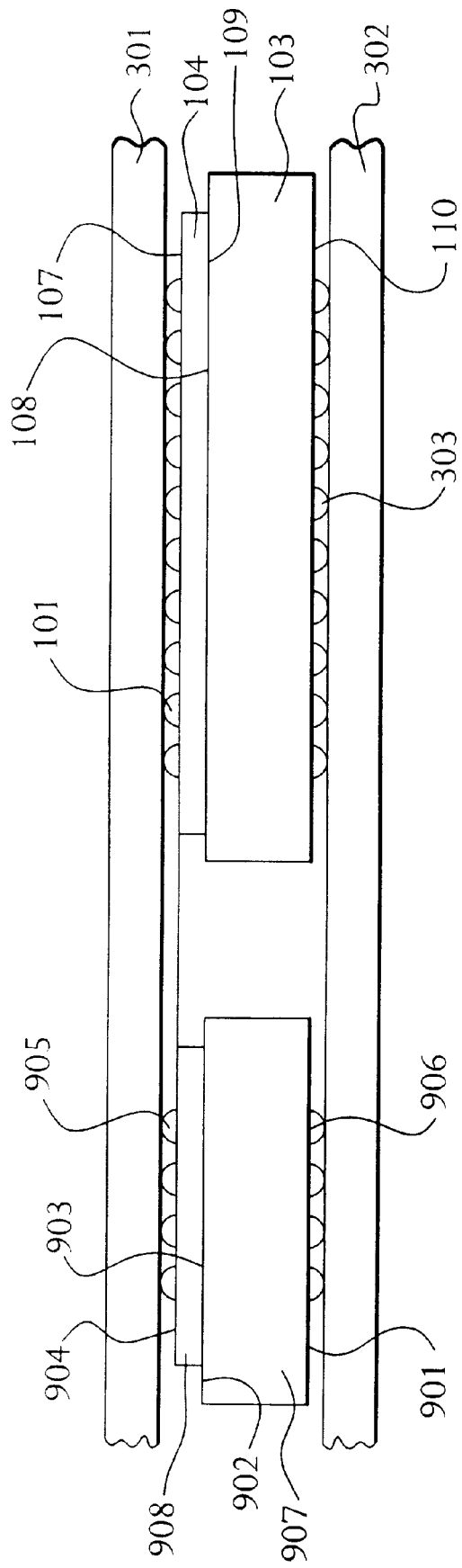
FIG. 9 is a side view of an alternative embodiment for locating strain relief elements.

FIG. 9 is a side view of an alternative embodiment for locating strain relief elements. As shown in FIG. 9, these different housings may be located some distance from connector 100. Plug 104 mounts to substrate 301 via solder balls 101, preferably with present reflow techniques used in Ball Grid Array (BGA) technology. Similarly, receptacle 103 mounts to substrate 302 via solder balls 303. Because contacts 102 and 417 are electrically connected to solder balls 303 and 101, respectively, when connector 100 is in a closed, mated position (as shown in FIGS. 2–4), substrate 301 is electrically interconnected to substrate 302. Either one or both of substrates 301 and 302 may be flexible circuit substrates. Plug 908 mounts to substrate 301 via solder balls 905. Similarly, receptacle 907 mounts to substrate 302 via solder balls 906. As discussed with reference to FIG. 4, the contacts to which solder balls 905 and 906 attach may not pass through their housings 907 and 908, respectively. Plug 908 and receptacle 907 are removably engageable. Plug 908 has a mounting end 904 facing substrate 301 and a mating end 903 facing receptacle 907. Similarly, receptacle 907 has a mounting end 901 facing substrate 302 and a mating end 902 facing plug 104. Although not shown in FIG. 9, it should be appreciated that solder balls 905 and 906 may be located anywhere on substrates 301 and 302. The particular location of solder balls 905 and 906 will vary depending on the location most likely to undergo thermal stresses, which may vary with the particular application of connector system 100.

Those skilled in the art will appreciate that numerous changes and modifications may be made to the preferred embodiments of the invention and that such changes and modifications may be made without departing from the spirit of the invention. For example, it should be understood that solder balls 101, 303 may be placed in numerous arrangements, including the demonstrated matrix array. It should also be understood that FIGS. 5–9 demonstrate just a few of the many possible configurations of temperature-induced strain relief solder balls. It is therefore intended that the appended claims cover all such equivalent variations as fall within the true spirit and scope of the invention.

I claim:

1. An electrical connector, comprising:

a housing having a solid portion;

a first plurality of elongated contacts in said housing and adapted to be in electrical communication with a first substrate, each of said first plurality of contacts having a first and second end, each first end of said first plurality of contacts extending from the housing solid portion to engage contacts of a mating connector;

a second plurality of elongated contacts in said housing and adapted to be coupled to said first substrate, each of said second plurality of contacts having a first and second end, each first end of said second plurality of contacts embedded within said housing solid portion such as to not be capable of engaging contacts of the mating connector, each second end of said first plurality of contacts and each second end of said second plurality of contacts being substantially similarly shaped;

a first body of reflowable, electrically conductive material disposed on at least one of said second ends of said first plurality of contacts, said first body being adapted to provide an electrical path between said connector and said first substrate; and a second body of reflowable material disposed on a first end of at least one of said second ends of said second plurality of contacts, said second body being adapted to provide relief for mechanical strain between said connector and said first substrate.

2. The electrical connector of claim 1, wherein said housing has a surface adjacent said substrate, all of said first and second bodies mounted to said surface, said surface having a constant height above said substrate.

3. The electrical connector of claim 1, wherein said first and second plurality of contacts form a matrix array.

4. A connection system for electrical connection between a first substrate and a second substrate, comprising:

a first electrical connector, comprising:
a first housing having a first side, a second side, and solid portions between said first and second sides,
a first plurality of elongated contacts, having first and second ends, said first ends extending from said first side of said first housing,
a second plurality of elongated contacts, having first and second ends, said first ends terminating within said solid portions of said first housing,
a first body of material disposed on said second ends of said first plurality of contacts and said second ends of said second plurality of contacts, wherein said first body of material is adapted to be connected to said first substrate and wherein each second end of said first plurality of contacts and each second end of said second plurality of contacts are substantially similarly shaped; and a second electrical connector mateable with said first connector, said second electrical connector, comprising:
a second housing having a first side, a second side, and solid portions between said first and second sides, wherein said first side of said second housing is adapted to be removably connected to said first side of said first housing,
a third plurality of elongated contacts having first and second ends, said first ends extending from said first side of said second housing, and
a fourth plurality of elongated contacts having first and second ends, said first ends terminating within said solid portions of said second housing, and
a second body of material disposed on said second ends of said third plurality of contacts and said second ends of said fourth plurality of contacts, wherein said second body of material is adapted to be connected To said second substrate and wherein each second end of said third plurality of contacts and each second end of said fourth plurality of contacts are substantially similarly shaped;

wherein said first and third plurality of contacts are disposed to electrically mate upon mating of the first and second electrical connectors and said second and fourth plurality of contacts do not mate upon mating of the first and second electrical connector; and said first and second electrical connectors each having intermateable contacts for electrically interconnecting said first and second substrates.

5. The device of claim 4, wherein said first and second body of material are generally spherically shaped and have substantially similar diameters.

6. The device of claim 4, wherein said first end of said first and third plurality of contacts are embedded within said solid portions of said first and second housings, respectively.

7. The device of claim 4, wherein said first and second body of material are composed of reflowable electrically conductive material.

8. A method for providing mechanical strain relief connector system, comprising;

providing a housing having a solid portion;

providing an electrical connector having a first and second plurality of elongated contacts;

disposing a first body of reflowable, electrically conductive material on at least one of said first plurality of contacts, said first body having a center and being adapted to provide an electrical path between said connector and a first substrate; and disposing a second body of reflowable material on at least one of said second plurality of contacts, said second body having a center and being adapted to provide relief for mechanical strain between said connector and said first substrate;

wherein each of said first plurality of contacts and each of said second plurality of contacts is provided with a first end and a second end, each first end of said first plurality of contacts extending from said housing solid portion for mating with a mating connector, each second end of said first plurality of contacts disposed within said first body, each said first end of said second plurality of contacts is embedded within said solid portion of said housing, each said second end of said second plurality of contacts is disposed within said second body, whereby said second plurality of contacts provides mechanical strain relief, and wherein each second end of said first plurality of contacts and each second end of said second plurality of contacts are substantially similarly shaped.

* * * * *

UNITED STATES PATENT AND TRADEMARK OFFICE
CERTIFICATE OF CORRECTION

PATENT NO.    : 6,558,170 B1
DATED         : May 6, 2003
INVENTOR(S)   : Timothy A. Lemke It is certified that error appears in the above-identified patent and that said Letters Patent is hereby corrected as shown below:

<u>Column 8,</u>
Line 38, the word "To" should not be capitalized.
Line 53, the word "end" should be -- ends. --

Signed and Sealed this

Thirteenth Day of April, 2004

JON W. DUDAS
*Acting Director of the United States Patent and Trademark Office*